United States Patent
Farmer et al.

(10) Patent No.: US 10,141,529 B1
(45) Date of Patent: Nov. 27, 2018

(54) ENHANCING DRIVE CURRENT AND INCREASING DEVICE YIELD IN N-TYPE CARBON NANOTUBE FIELD EFFECT TRANSISTORS

(71) Applicant: International Business Machines Corporation, Armonk, NY (US)

(72) Inventors: Damon B. Farmer, Eastchester, NY (US); Shu-Jen Han, Cortlandt Manor, NY (US); Jianshi Tang, Elmsford, NY (US); John J. Yurkas, Stamford, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/813,526

(22) Filed: Nov. 15, 2017

Related U.S. Application Data (63) Continuation of application No. 15/602,890, filed on May 23, 2017.

(51) Int. Cl.
*H01L 29/06* (2006.01)
*H01L 51/10* (2006.01)
*H01L 51/05* (2006.01)
*H01L 51/00* (2006.01)

(52) U.S. Cl.
CPC ........ *H01L 51/105* (2013.01); *H01L 51/0048* (2013.01); *H01L 51/0545* (2013.01); *H01L 51/0566* (2013.01); *H01L 2251/301* (2013.01)

(58) Field of Classification Search
CPC ................... H01L 51/0048; H01L 51/0545
See application file for complete search history.

(56) References Cited

U.S. PATENT DOCUMENTS

2013/0087765 A1* 4/2013 Kim .............. H01L 33/04
257/13

OTHER PUBLICATIONS

List of IBM Patents or Patent Applications Treated as Related (Appendix P); Filed Nov. 15, 2017, 2 pages.
Damon B. Farmer, et al. "Enhancing Drive Current and Increasing Device Yield in N-Type Carbon Nanotube Field Effect Transistors," U.S. Appl. No. 15/602,890, filed May 23, 2017.

* cited by examiner

*Primary Examiner* — Samuel Gebremariam
(74) *Attorney, Agent, or Firm* — Cantor Colburn LLP; Vazken Alexanian (57) ABSTRACT

Embodiments of the invention are directed to methods and resulting structures for enhancing drive current and increasing device yield in n-type carbon nanotube field effect transistors (CNT FETs) with scaled contacts using a wetting layer. In some embodiments of the invention, a nanotube is formed over a surface of a substrate. An insulating layer is formed over the nanotube such that end portions of the nanotube are exposed. A low work function metal is formed over the end portions of the nanotube and a wetting layer is formed between the low work function metal and the nanotube.

14 Claims, 7 Drawing Sheets

ENHANCING DRIVE CURRENT AND INCREASING DEVICE YIELD IN N-TYPE CARBON NANOTUBE FIELD EFFECT TRANSISTORS

DOMESTIC AND/OR FOREIGN PRIORITY

This application is a continuation of U.S. application Ser. No. 15/602,890, titled "ENHANCING DRIVE CURRENT AND INCREASING DEVICE YIELD IN N-TYPE CARBON NANOTUBE FIELD EFFECT TRANSISTORS" filed May 23, 2017, the entire contents of which are incorporated herein by reference.

BACKGROUND

The present invention generally relates to fabrication methods and resulting structures for semiconductor devices. More specifically, the present invention relates to enhancing drive current and increasing device yield in n-type carbon nanotube field effect transistors (CNT FETs) with scaled contacts using a wetting layer.

In contemporary semiconductor device fabrication processes a large number of semiconductor devices, such as field effect transistors (FETs), are fabricated on a single wafer. In some FET device configurations, carbon nanotubes (CNTs) are incorporated in the FET design. CNTs provide an intrinsically ultra-thin body and exceptional electrical properties (e.g., high drive currents, superior current on/off ratios, and a long mean-free-path for ballistic transport), which makes CNT FETs one of the most promising candidates for the sub-10 nm technology node. CNT FETs, like traditional FETs, include a gate, a source, and a drain. In a CNT FET, carbon nanotubes span lengthwise between source and drain regions such that the ends of each nanotube are in contact with the source or drain. Each of the carbon nanotubes defines a conductive media or "channel" for the CNT FET. Gating of the channel occurs by modulation of the barrier heights of the junctions between the carbon nanotubes and the conductive source/drain regions.

SUMMARY

Embodiments of the present invention are directed to a method for fabricating a semiconductor device. A non-limiting example of the method includes forming a nanotube over a surface of a substrate. An insulating layer is formed over the nanotube such that end portions of the nanotube are exposed. A low work function metal is formed over the end portions of the nanotube. A wetting layer is formed between the low work function metal and the nanotube.

Embodiments of the invention are directed to semiconductor device. A non-limiting example of the semiconductor device includes a nanotube formed over a surface of a substrate. An insulating layer is patterned on portions of the nanotube such that end portions of the nanotube are not covered by the insulating layer. A low work function metal is formed over the end portions of the nanotube. A wetting layer is formed between the low work function metal and the nanotube.

Embodiments of the present invention are directed to a method for fabricating a semiconductor device. A non-limiting example of the method includes forming a carbon nanotube over a surface of a substrate. A dielectric layer is formed between the carbon nanotube and the substrate. An insulating layer is formed over the carbon nanotube. Portions of the insulating layer are removed to expose end portions of the carbon nanotube and a low work function metal is formed over the exposed end portions. A wetting layer is formed between the low work function metal and the carbon nanotube. A capping layer is formed over the low work function metal.

Embodiments of the invention are directed to semiconductor device. A non-limiting example of the semiconductor device includes a dielectric layer formed on a surface of a substrate. A carbon nanotube is formed on a surface of the dielectric layer. An insulating layer is patterned on portions of the carbon nanotube such that end portions of the nanotube are not covered by the insulating layer. A low work function metal is formed over the end portions of the nanotube. A wetting layer is formed between the low work function metal and the nanotube. A capping layer is formed on the low work function metal.

Embodiments of the invention are directed to an electrode stack of a carbon nanotube field effect transistor. A non-limiting example of the electrode stack includes a wetting layer formed on an end portion of a carbon nanotube. A low work function metal is formed over the end portion of the carbon nanotube on the wetting layer. A capping layer is formed on the low work function metal.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as previously noted herein, CNT FETs are positioned as one of the most promising candidates for the sub-10 nm technology node. There are challenges, however, in integrating CNT FETs into the complementary metal oxide semiconductor (CMOS) architecture. For example, the implementation of a carbon nanotube-based CMOS device with low standby power dissipation requires the formation of n-type and p-type CNT FETs having comparably robust high-performance, which is difficult to achieve using conventional methods.

The type of CNT FET (n or p-type) is determined by the nature of the contact formed between the contact metal and the carbon nanotube. In general, the use of a high work function contact metal results in p-type behavior, while the use of a low work function contact metal results in n-type behavior. Consequently, the relative performance of n-type CNT FETs, in terms of drive current, is worse than their p-type counterparts. Conventional approaches to improving the drive current of n-type CNT FETs have not been wholly successful. Some conventional solutions employ work function engineering at the contact in conjunction with potential engineering of the device channel by dielectric passivation to produce comparable n-type versus p-type behavior. These types of approaches, however, limit device scaling by increasing the complexity of fabrication and reducing device yield. Solutions for increasing the n-type CNT FET drive current should be scalable, i.e., the device yield should not significantly degrade as the contact length (Lc) is decreased.

Turning now to an overview of aspects of the present invention, one or more embodiments of the invention provide methods and structures configured to increase both the drive current in n-type carbon nanotubes and the yield of operational devices in which the contact lengths (Lc) are scaled. In some embodiments of the invention, this can be accomplished by using a wetting layer between the nanotube and the low work function contact metal. For example, titanium, a metal that is known to wet a carbon nanotube surface well, can be used as the wetting layer. In some embodiments of the invention, the wetting layer is deposited onto the carbon nanotube surface prior to the main contact material of the electrode (e.g., a CNT n-type metal material such as Sc). The wetting layer improves physical and electrical contact to the carbon nanotube and provides a more efficient injection of charge carriers through the carbon nanotube/electrode interface. In this manner, incorporation of the wetting layer results in both a larger drive current and an improved device yield.

Figure 1:
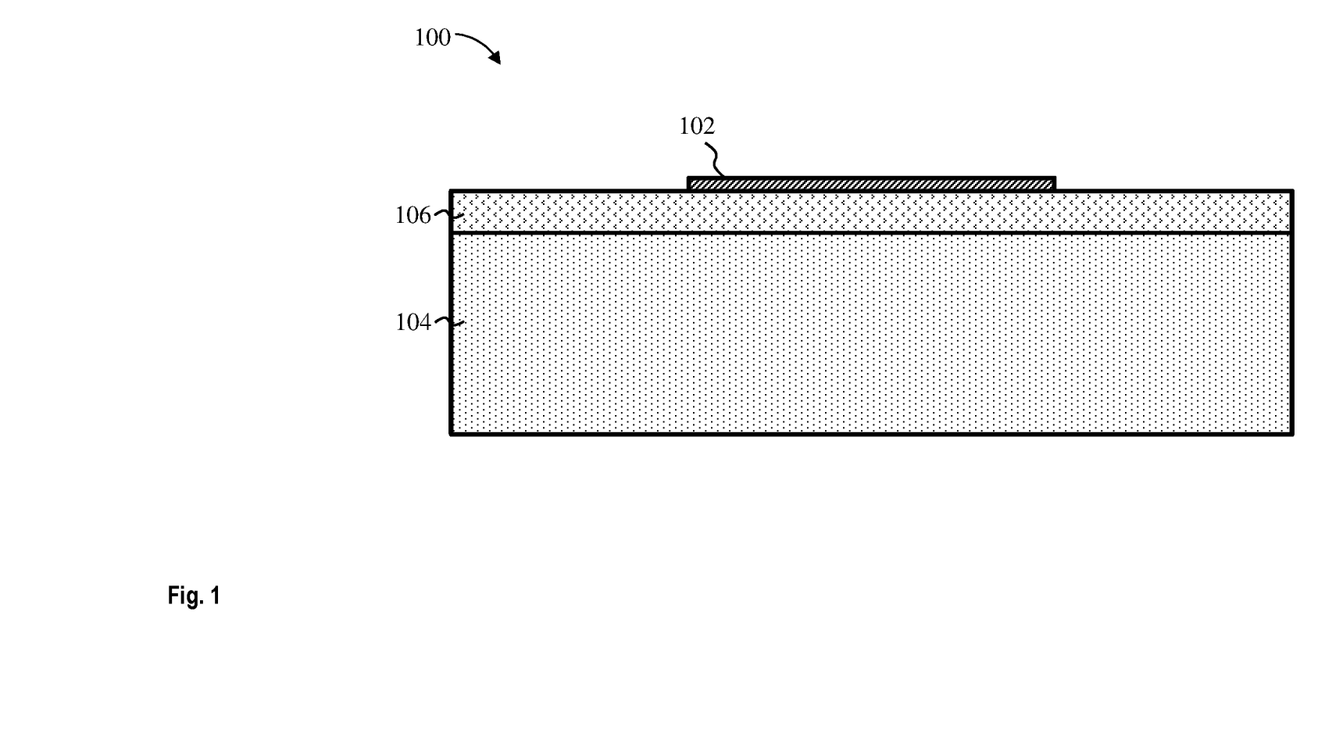
FIG. 1 depicts a cross-sectional view of a semiconductor structure after a processing operation according to one or more embodiments of the present invention.

Turning now to a more detailed description of aspects of the present invention, FIG. 1 depicts a cross-sectional view of a structure 100 having a carbon nanotube 102 formed over a substrate 104 during an intermediate operation of a method of fabricating a semiconductor device according to one or more embodiments of the invention. The carbon nanotube 102 can be deposited, transferred, or grown using known front-end-of-line (FEOL) nanotube fabrication techniques. For example, in some embodiments of the invention the carbon nanotube 102 is placed on the substrate 104 using a spin on coating process. The thickness of this coating is preferably substantially less than the length of the carbon nanotubes such that when the coating is spun onto the substrate, the carbon nanotubes will tend to lay flat, i.e., with their axes substantially parallel to the plane of the substrate 104. In other embodiments of the invention, the carbon nanotube 102 is formed using CVD, plasma enhanced CVD (PECVD), chemical solution deposition, electrophoretic deposition, or other like processes. The carbon nanotube 102 can have a diameter ranging from 0.1 nm to 10 nm. The carbon nanotube 102 can have a contact length (i.e., the length of an end of the carbon nanotube in contact with an electrode) ranging from 5 nm to over a micron. For example, the contact length of the carbon nanotube 102 can be 40 nm or 750 nm, although other lengths are within the contemplated scope of the invention.

The substrate 104 can include any suitable substrate material, such as, for example, semiconductor or conducting material. Semiconductor materials include monocrystalline Si, SiGe, SiC, III-V compound semiconductor, II-VI compound semiconductor, or semiconductor-on-insulator (SOI). Conducting materials include metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The substrate 104 can further include dopants that are incorporated during or after deposition. For example, the substrate 104 can be doped during deposition (in-situ doped) or doped following the epitaxy by adding n-type dopants (e.g., As, P, Sb) or p-type dopants (e.g., Ga, B, $BF_2$, Al). The dopant concentration can range from $1 \times 10^{19}$ $cm^{-3}$ to $2 \times 10^{21}$ $cm^{-3}$, or between $1 \times 10^{20}$ $cm^{-3}$ and $1 \times 10^{21}$ $cm^{-3}$.

A dielectric layer 106 (also known as a gate dielectric) can be formed between the carbon nanotube 102 and the substrate 104. The dielectric layer 106 can be any suitable dielectric material, such as, for example, silicon dioxide, silicon nitride, and high-k dielectric material. The high-k dielectric material can be a dielectric material having a dielectric constant greater than, for example, 3.9, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k dielectric materials with a dielectric constant greater than 7.0 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric materials can further include dopants such as, for example, lanthanum and aluminum. The dielectric layer 106 can be formed by any suitable deposition processes, for example, CVD, PECVD, ALD, evaporation, PVD, chemical solution deposition, or other like processes.

Figure 2:
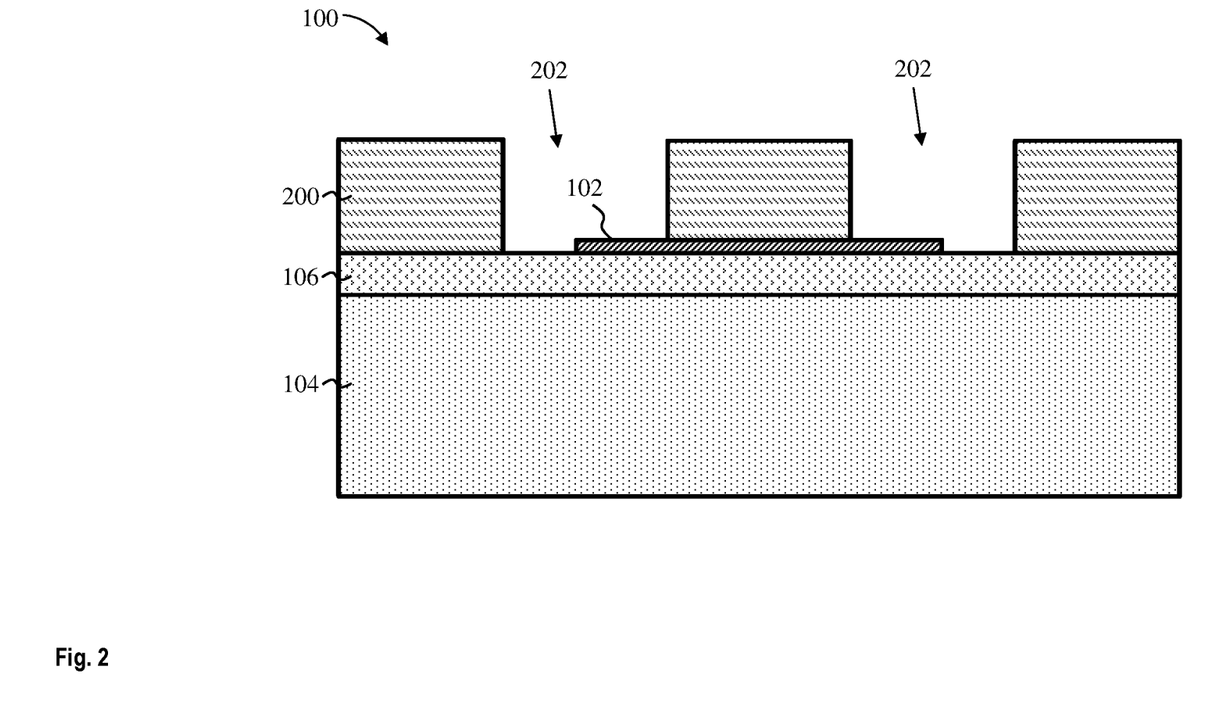
FIG. 2 depicts a cross-sectional view of the semiconductor structure after a processing operation according to one or more embodiments of the present invention.

FIG. 2 depicts a cross-sectional view of the structure 100 after forming an insulating layer 200 over the carbon nanotube 102 and the dielectric layer 106 during an intermediate operation of a method of fabricating a semiconductor device according to one or more embodiments of the invention. The insulating layer 200 can include a dielectric material, such as, for example, SiN, SiC, SiOC, SiCN, BN, SiBN, SiBCN, SiOCN, $SiO_xN_y$, and combinations thereof. The dielectric material can be a low-k material having a dielectric constant less than about 7, less than about 5, or even less than about 2.5. The insulating layer 200 can be formed using known deposition processes, such as, for example, CVD, PECVD, ALD, PVD, chemical solution deposition, or other like processes.

Figure 4:
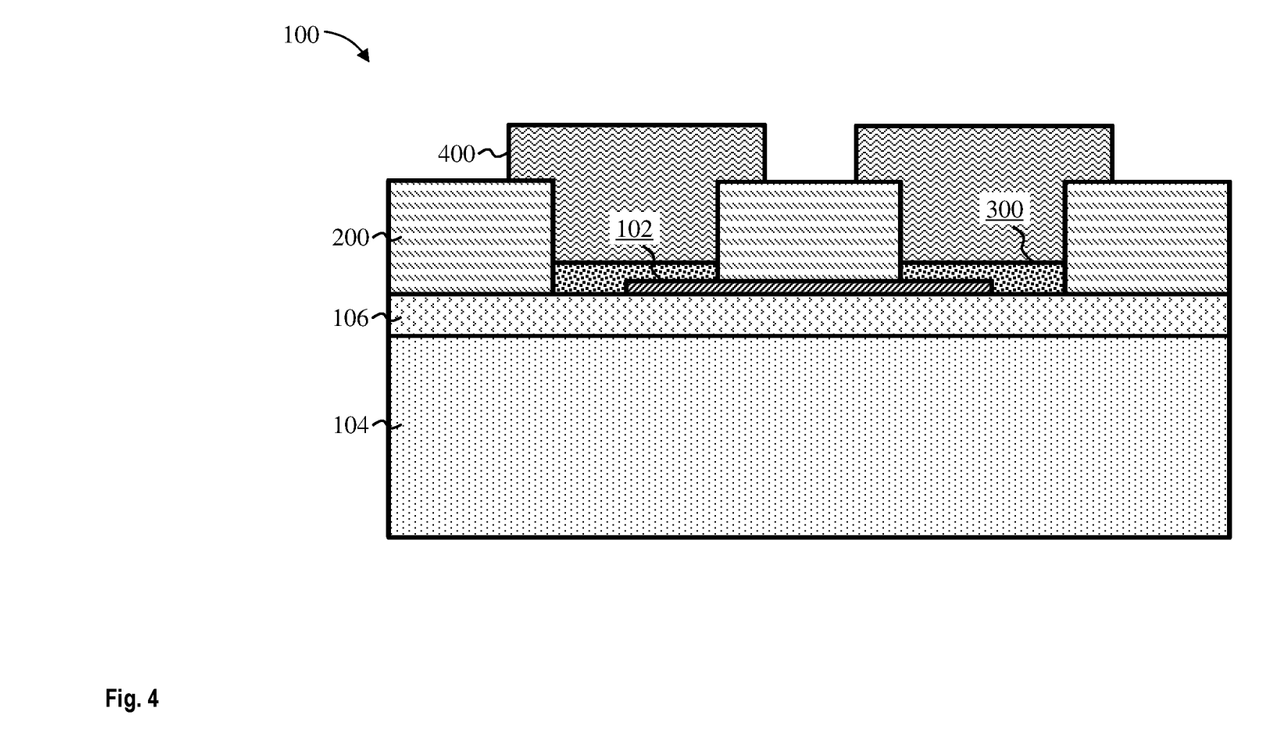
FIG. 4 depicts a cross-sectional view of the semiconductor structure after a processing operation according to one or more embodiments of the present invention.

The insulating layer 200 is patterned to expose end portions of the carbon nanotube 102. In some embodiments of the present invention, portions of the insulating layer 200 are removed to formed source/drain trenches 202. The source/drain trenches 202 define the source/drain contact regions. The patterned insulating layer 200 prevents oxidation of the low work function metal 400 (contact metal) at the nanotube/metal interface (as depicted in FIG. 4). The insulating layer 200 can be patterned using, for example, a wet etch, a dry etch, or a combination thereof. In some embodiments of the present invention, the insulating layer 200 is patterned with hydrogen silsesquioxane (HSQ), which can be spun onto a surface of the insulating layer 200 and patterned by electron-beam lithography. The pattern can then be transferred into the insulating layer 200.

Figure 3:
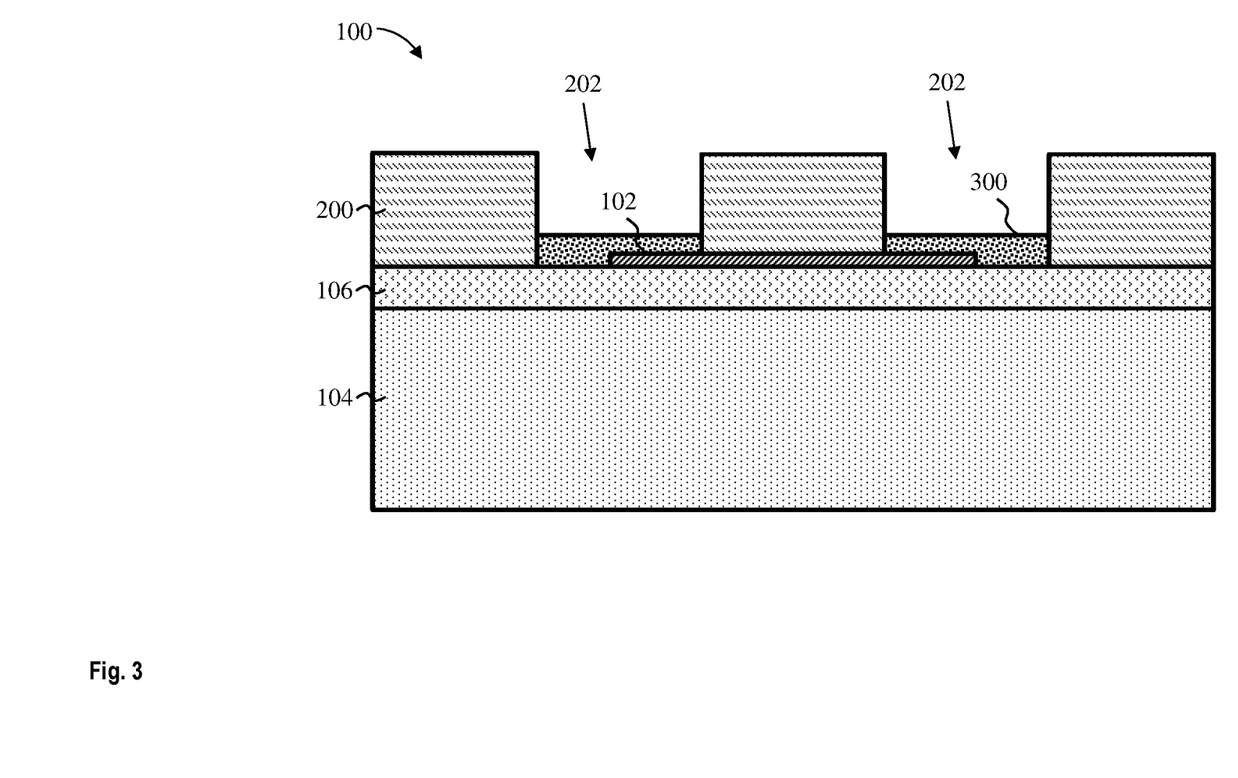
FIG. 3 depicts a cross-sectional view of the semiconductor structure after a processing operation according to one or more embodiments of the present invention.

FIG. 3 depicts a cross-sectional view of the structure 100 after forming a wetting layer 300 on the exposed end portions of the carbon nanotube 102 and on portions of the dielectric layer 106 during an intermediate operation of a method of fabricating a semiconductor device according to one or more embodiments of the invention. A material of the wetting layer 300 is selected such that the wetting layer 300 makes good physical and electrical contact with a surface of the carbon nanotube 102. For example, the wetting layer 300 can include any suitable metal or metallic material known to wet a carbon nanotube surface. In some embodiments of the present invention, the wetting layer 300 includes titanium, nickel, or palladium.

Figure 5:
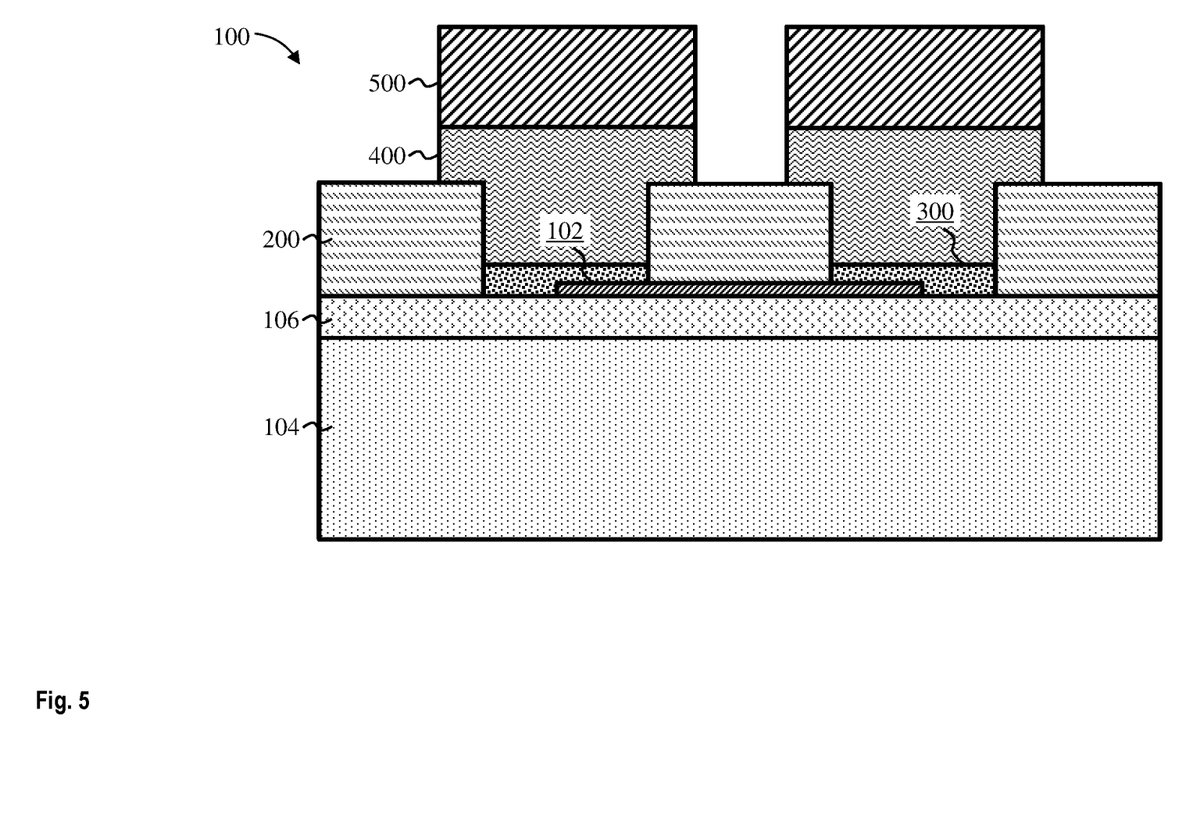
FIG. 5 depicts a cross-sectional view of the semiconductor structure after a processing operation according to one or more embodiments of the present invention.

The wetting layer 300 can be deposited by any suitable deposition process, such as, for example, CVD, PECVD, PVD, plating, thermal or e-beam evaporation, sputtering, or combinations thereof. The wetting layer 300 can be formed to any desirable thickness. In some embodiments of the present invention, the wetting layer 300 partially fills the source/drain trenches 202. In some embodiments of the present invention, the wetting layer 300 is formed to a thickness of about 0.1 nm to about 2 nm. In some embodiments of the present invention, the wetting layer 300 is co-formed with the low work function metal 400 (as depicted in FIG. 4) and the capping layer 500 (as depicted in FIG. 5). Co-forming the wetting layer 300 in this manner advantageously increases the final device drive current relative to the maximum drive current achievable by forming the wetting layer 300 separately using a different deposition system.

FIG. 4 depicts a cross-sectional view of the structure 100 after forming a low work function metal 400 over the exposed end portions of the carbon nanotube 102 and on portions of the dielectric layer 106 during an intermediate operation of a method of fabricating a semiconductor device according to one or more embodiments of the invention. As discussed previously herein, the low work function metal 400 facilitates n-type behavior in CNT FETs. The low work function metal 400 can be made of any suitable material for n-type CNT FETs, such as, for example, scandium, calcium, potassium, sodium, erbium.

The low work function metal 400 (also known as a contact electrode) is patterned using, for example, known electron-beam or photolithography techniques. For example, in some embodiments of the present invention, the low work function metal 400 is formed using a polymethyl methacrylate (PMMA) resist in conjunction with electron-beam lithography. In some embodiments of the present invention, the low work function metal 400 is formed on the wetting layer 300 to fill the remaining portions of the source/drain trenches 202. In some embodiments of the present invention, the low work function metal 400 is formed to a thickness of about 1 nm to about 50 nm, although other thicknesses are within the contemplated scope of the invention. In some embodiments of the present invention, the low work function metal 400 is overfilled into the source/drain trenches 202, forming overburdens above a surface of the insulating layer 200.

FIG. 5 depicts a cross-sectional view of the structure 100 after forming a capping layer 500 over the low work function metal 400 during an intermediate operation of a method of fabricating a semiconductor device according to one or more embodiments of the invention. The capping layer 500 can include any inert metal that can be deposited onto the low work function metal 400 and serves to prevent deleterious reactions (e.g., oxidation) of the low work function metal 400 with the environment (i.e., water and oxygen). For example, the capping layer 500 can include gold, palladium, titanium, or aluminum. The capping layer 500 can be formed to a same thickness or a different thickness as the low work function metal 400. In some embodiments of the present invention, the capping layer 500 is formed to a thickness of about 1 nm to about 50 nm, although other thicknesses are within the contemplated scope of the invention. As illustrated in FIG. 5, the completed CNT FET includes a low work function metal 400 (contact electrodes) serving as the source and drain and a conducting substrate 104 serving as the gate.

Figure 6:
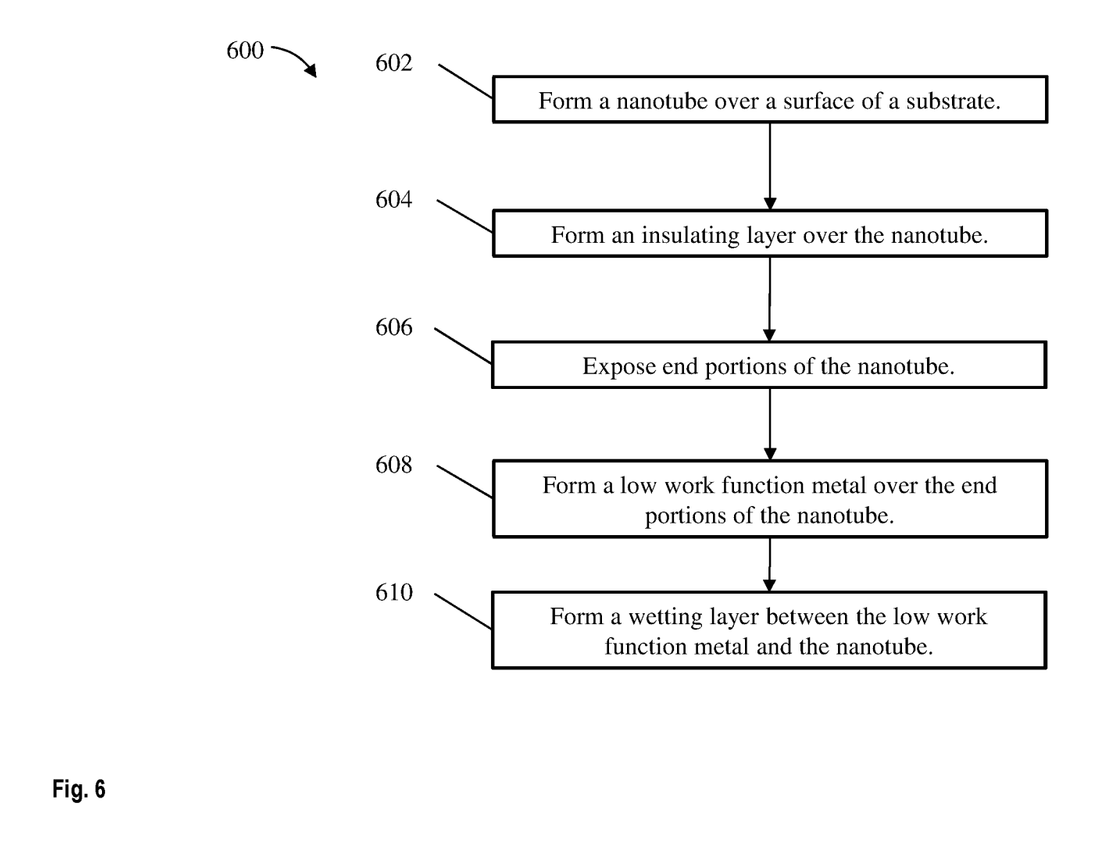
FIG. 6 depicts a flow diagram illustrating a method according to one or more embodiments of the invention.

FIG. 6 depicts a flow diagram 600 illustrating a method for forming a semiconductor device according to one or more embodiments of the invention. As shown at block 602, a nanotube is formed over a surface of a substrate. The nanotube can be formed in a similar manner as the carbon nanotube 102 depicted in FIG. 1 according to one or more embodiments.

As shown at block 604, an insulating layer is formed over the nanotube. The insulating layer can be formed in a similar manner as the insulating layer 200 depicted in FIG. 2. As shown at block 606, end portions of the nanotube are exposed. As discussed previously herein, the insulating layer can be patterned to expose the end portions of the nanotube.

As shown at block 608, a low work function metal is formed over the end portions of the nanotube. The low work function metal can be formed in a similar manner as the low work function metal 400 depicted in FIG. 4. As discussed previously herein, the low work function metal can include any suitable material for n-type CNT FETs, such as, for example, scandium, and can have a thickness of about 1 nm to about 50 nm.

As shown at block 610, a wetting layer is formed between the low work function metal and the nanotube. The wetting layer can be formed in a similar manner as the wetting layer 300 depicted in FIG. 3. As discussed previously herein, a material of the wetting layer is selected such that the wetting layer makes good physical and electrical contact with a surface of the nanotube. In some embodiments of the present invention, the wetting layer includes titanium having a thickness of about 0.1 nm to about 1 nm.

Figure 7:
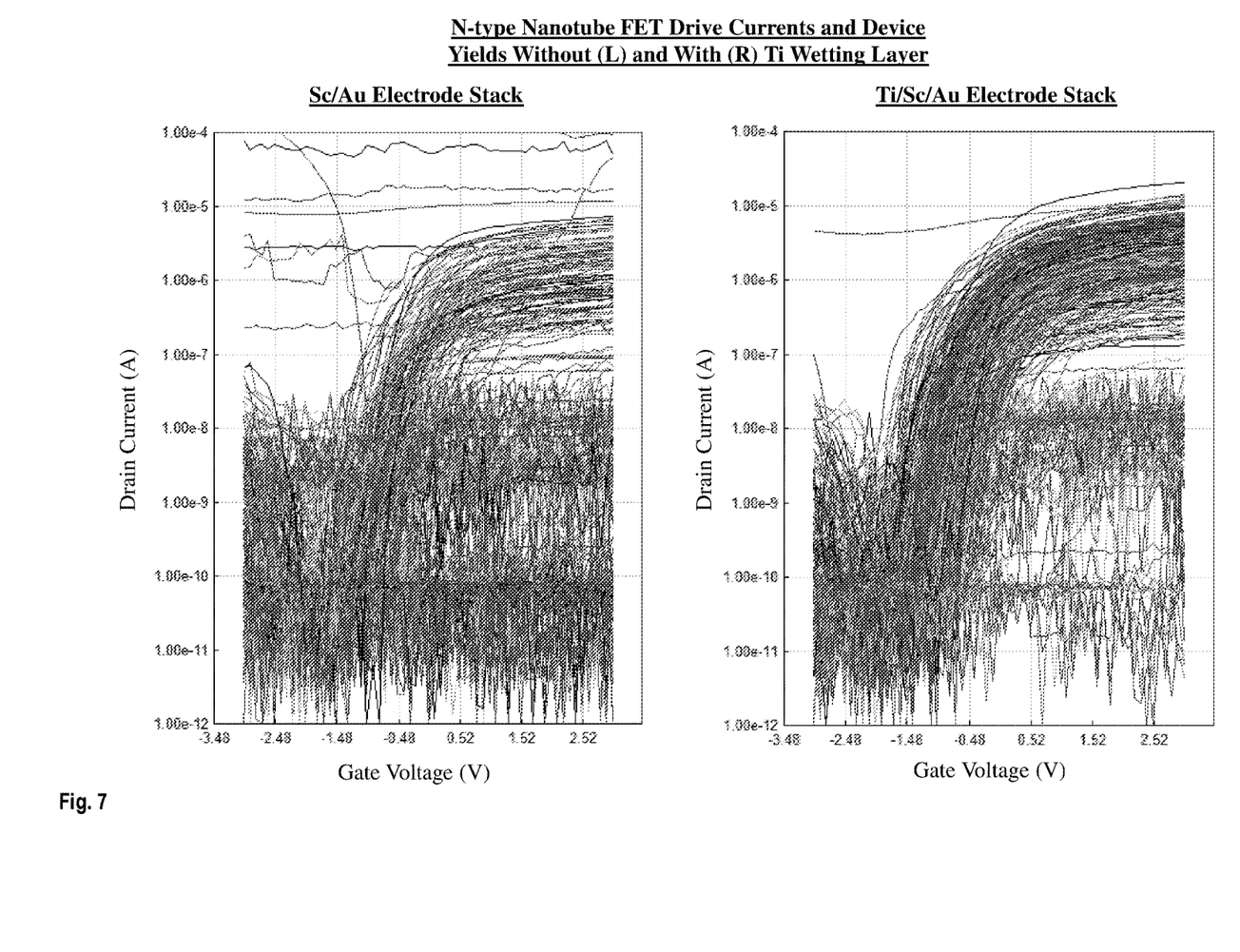
FIG. 7 depicts the effect of a wetting layer formed according to one or more embodiments of the invention on drive currents and device yields for n-type carbon nanotubes.

FIG. 7 depicts the effect of a wetting layer formed according to one or more embodiments of the invention on drive currents and device yields for n-type carbon nanotubes. All devices were formed with scandium/gold electrode stacks and the channel length was controlled to about 40 nm. As illustrated in FIG. 7, the wetting layer improved the average drive current from about 0.46 µA to about 0.77 µA. The wetting layer also improve device yield with 81 out of 367 devices working without the wetting layer and 226 out of 367 devices working with the wetting layer.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and can not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
    forming a nanotube over a surface of a substrate;
    forming an insulating layer over the nanotube;
    exposing end portions of the nanotube;
    forming a low work function metal over the end portions of the nanotube;
    forming a wetting layer between the low work function metal and the nanotube; and
    forming a capping layer over the low work function metal, wherein the capping layer comprises gold.

2. The method of claim 1 further comprising forming a dielectric layer between the nanotube and the substrate.

3. The method of claim 2, wherein the dielectric layer comprises silicon dioxide.

4. The method of claim 1, wherein the nanotube comprises a carbon nanotube.

5. The method of claim 1, wherein the substrate comprises doped silicon or a metal.

6. The method of claim 1, wherein the insulating layer comprises silicon nitride.

7. The method of claim 1, wherein the low work function metal comprises scandium.

8. The method of claim 7, wherein the low work function metal further comprises a thickness of about 10 nm to about 50 nm.

9. The method of claim 1, wherein the wetting layer comprises titanium.

10. The method of claim 9, wherein the wetting layer further comprises a thickness of about 0.1 nm to about 1 nm.

11. The method of claim 1, wherein the capping layer further comprises a thickness of about 10 nm to about 50 nm.

12. The method of claim 1, wherein the wetting layer comprises titanium, the low work function metal comprises scandium, and the capping layer comprises gold.

13. A method for forming a carbon nanotube field effect transistor, the method comprising:
    forming a carbon nanotube over a surface of a substrate;
    forming a dielectric layer between the carbon nanotube and the substrate;
    forming an insulating layer over the carbon nanotube;
    removing portions of the insulating layer to expose end portions of the carbon nanotube;

forming a low work function metal over the end portions of the carbon nanotube; and forming a wetting layer between the low work function metal and the carbon nanotube; and forming a capping layer over the low work function metal.

14. The method of claim 13, wherein the wetting layer comprises titanium, the low work function metal comprises scandium, and the capping layer comprises gold.

* * * * *